United States Patent
Hsiao et al.

(10) Patent No.: US 6,543,988 B2
(45) Date of Patent: Apr. 8, 2003

(54) APPARATUS FOR CLAMPING AND TRANSPORTING A SEMICONDUCTOR WAFER

(75) Inventors: Yi-Li Hsiao, Chiai (TW); Cheng-Chieh Hung, Hsinchu (TW); Yu-Tsung Fu, Miao-Li (TW); Weng-Liang Fang, Hsinchu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 09/908,528

(22) Filed: Jul. 18, 2001

(65) Prior Publication Data

US 2003/0017042 A1 Jan. 23, 2003

(51) Int. Cl.$^7$ .................................................. B25J 9/15
(52) U.S. Cl. ................................ 414/744.5; 294/119.1; 901/47
(58) Field of Search ........................... 414/744.5, 744.1, 414/744.2, 783; 901/47; 294/119.1, 907

(56) References Cited

U.S. PATENT DOCUMENTS

| | | | | |
|---|---|---|---|---|
| 5,702,228 A | * | 12/1997 | Tamai et al. ............. | 414/744.5 |
| 5,762,391 A | * | 6/1998 | Sumnitsch ............... | 294/119.1 |
| 6,206,441 B1 | * | 3/2001 | Wen et al. .............. | 294/907 X |
| 6,322,119 B1 | * | 11/2001 | Schmidt et al. ......... | 294/907 X |
| 6,322,312 B1 | * | 11/2001 | Sundar .................... | 414/744.5 |

* cited by examiner

*Primary Examiner*—Donald W. Underwood
(74) *Attorney, Agent, or Firm*—Tung & Associates

(57) ABSTRACT

A wafer is carried on a blade supported on robotic arms. A plurality of guide clamps both move the wafer into a desired position on the blade and clamp the wafer in place during transport by the arms. The clamps are reciprocally mounted on the blade and are connected with and driven by a rotatable hub carried on the blade and rotated by the movement of the arms. Both the blade and the clamps include beveled surfaces that guide the wafer into place. The operation of the clamps is controlled by a laser that detects when the wafer is out of place or tilted on the blade.

11 Claims, 3 Drawing Sheets

APPARATUS FOR CLAMPING AND TRANSPORTING A SEMICONDUCTOR WAFER

FIELD OF THE INVENTION

The present invention broadly relates to semiconductor processing equipment, and deals more particularly with a robotic system for transporting semiconductor wafers between any of a plurality of processing stations.

BACKGROUND OF THE INVENTION

The need for increasing yield and through-put in semiconductor manufacturing systems has resulted in the development of highly specialized and automated systems for processing and handling semiconductor wafers. Wafers are typically stored in a cassette with their flat surfaces horizontal. The cassettes are transferred from station to station by automatic material handling equipment. Once delivered to a processing station, individual wafers are transferred from the cassette by an automatically controlled robot that typically includes a robotic arm carrying a wafer supporting blade on its outer end. The blade is moved in a manner to pick up individual wafers such that the wafer lays flat on the blade during the transfer process. This arrangement has the advantage that a wafer is held on the end of the robotic arm through force of gravity, thus avoiding the application of unnecessary or unbalanced forces to the wafer that could result in damage to the wafer. In spite of the fact that the robotic arm for transferring the wafers is automatically controlled, slight misadjustments, errors caused by wear and software "glitches" can result in problems during the wafer transfer process. For example, in some cases, misalignment of certain components in the system, such as the blade, robotic arm or the cassette, can result in a wafer being loaded onto a blade such that the wafer is tilted relative to the blade, i.e., not horizontal on the blade. In other cases, although the wafer may be supported flat on the blade, the blade itself may be tilted before it lifts a wafer from the cassette. In still other cases, where the rotational position of the robotic arm relative to a cassette is not precisely indexed or where the blade is tilted out of its normal horizontal position, attempts to fetch a wafer from the cassette may result in the robotic arm or the blade colliding with a door-slit insert of the load lock chamber which in turn results in damaging or breaking the wafer. Even where the robot succeeds in lifting the wafer from the cassette, alignment errors in the transfer process can result in collisions between the process chamber pedestal, slit door, lower parts of the chamber and the wafer direct loading, unloading or transfer of the wafers.

The problem described above involving wafer damage due to errors in the transfer process have become more significant as the size of the wafer continues to grow, along with advances in wafer processing technology. This type of wafer damage reduces throughput and process yield, and is becoming more costly due to the larger size of wafers.

One partial solution to the above discussed problem is a so-called orienter chamber in which the robot transfers the wafer to a chamber whose sole purpose is to determine whether the wafer is properly positioned on the blade and then manipulate the wafer so that it is properly oriented on the blade before the wafer is transferred to other processing chambers. While the use of an orienter chamber has somewhat reduced wafer damage due to misalignment, this technique reduces throughput since valuable time is lost in transferring the wafer to and from the orienter chamber.

The present invention is directed toward overcoming the deficiencies of the prior art wafer transfer systems described above.

SUMMARY OF THE INVENTION

According to one aspect of the invention, apparatus is provided for holding and transferring a semiconductor wafer, comprising a robotic arm for transferring the wafer, a blade attached to a robotic arm for supporting and holding the wafer, clamping means for both moving the wafer into a desired, aligned, position and then clamping the wafer on the blade, and means for driving the clamping means between a retracted position and a closed, clamping position. The clamping means preferably comprises four clamping members respectively mounted on the corners of the blade which are normally spring biased to their open or retracted position. The clamping members are connected to a central hub that is rotatively mounted on the bottom of the blade and is driven to rotate by movement of the robotic arms. Each of the clamps includes a first, beveled surface that functions to engage the outer periphery of the wafer and move it into proper alignment, and a second, clamping surface that overlies the top of the wafer to hold on the blade in a properly aligned position. In the preferred embodiment, a laser detection system is employed to determine when the wafer is mis-aligned or "tilted" on the blade. If the wafer is not too far out of alignment, the clamping system is activated to move the wafer into proper position. Otherwise, the wafer transport sequence is interrupted to await manual intervention in order to correct the alignment problem.

In accordance with another aspect of the invention, apparatus is provided for holding and transporting a semiconductor wafer comprising a blade for supporting a wafer, a plurality of guide clamps reciprocally mounted on the blade at locations around the periphery of the wafer, and means for moving the guide clamps into engagement with the wafer in order to move the wafer to a desired, aligned position on the blade.

Accordingly, it is a primary object of the present invention to provide apparatus for transporting semiconductor wafers which assures that the wafers are held in proper alignment during the transfer process.

Another object of the invention is to provide apparatus as described above which eliminates the need for a dedicated chamber heretofore necessary for re-orienting the wafer so as to be properly aligned on the blade.

Another object of the invention is to provide apparatus of the type mentioned that permits wafer misalignment to be quickly corrected while also reducing the possibility that the wafer is scratched, dropped, or otherwise damaged during the re-alignment process.

A further object of the invention is to provide apparatus as described above which significantly increases the overall wafer transfer speed, and thus the throughput in the semiconductor manufacturing process.

These and further objects and advantages invention will be made clear or become apparent during the course of the following description of a preferred embodiment of the invention.

BRIEF DESCRIPTION OF THE DRAWINGS

In the drawings, which form an integral part of specification, and are to be read in conjunction therewith, and wherein which like reference numerals are employed to designate identical components in the various views.

DETAILED DESCRIPTION OF THE PREFERRED EMBODIMENT

Figure 1:
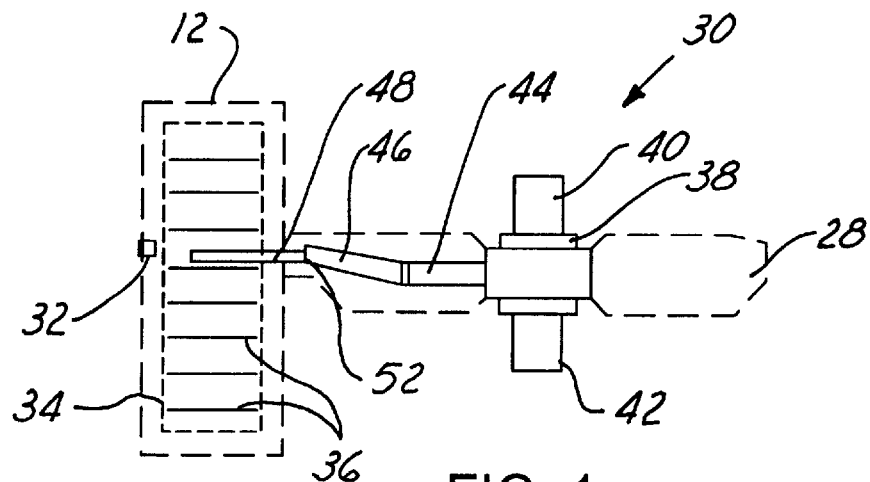
FIG. 1 is a diagrammatic, elevational view showing the relationship of the robotic arm to a wafer carrying cassette.
Figure 2:
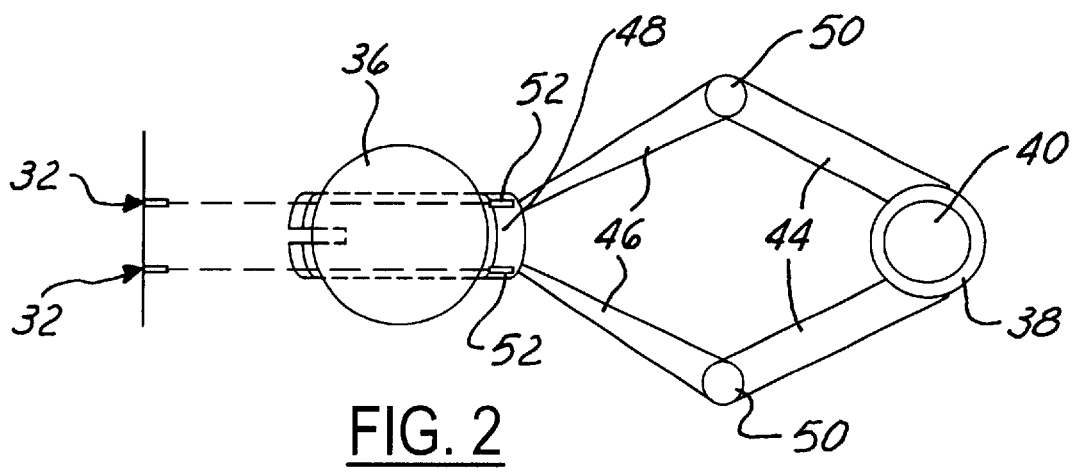
FIG. 2 is a plan view of the cassette and robotic arm shown in FIG. 1.
Figure 3:
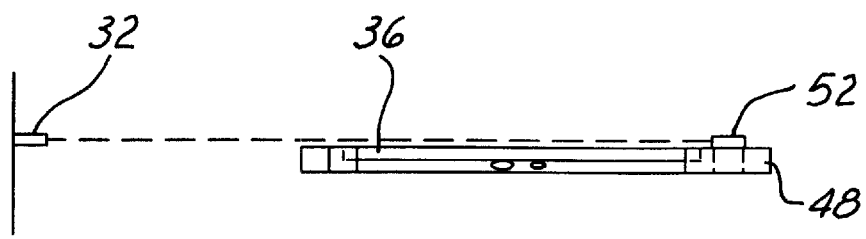
FIG. 3 is a diagrammatic, enlarged side view showing the relationship of the transfer blade, a wafer and a laser detection system employed to detect wafer misalignment.

Referring first to FIGS. 1–3, the present invention related to apparatus for detecting the proper orientation of a semiconductor wafer 36 held on a blade 48 and for shifting the wafer into proper alignment on the blade 48 when misalignment has been detected. Wafer 36 is only one of a plurality of wafers held in horizontal, stacked relationship to each other within a cassette 34 disposed within a load lock chamber 12. Typically, the cassettes 34 are transferred into and away from the load lock chamber 12 by means of a dedicate cassette transfer system (not shown) wherein the cassettes are transferred from station to station in pods.

A wafer transfer unit, generally indicated by the numeral 30, transfers individual wafers from the cassette 34 in load lock chamber 12 between each of a plurality of processing stations (not shown) and finally loads the wafer into a second cassette (not shown) which holds the processed wafers. Misalignment, misadjustment or other errors in the wafer transfer process can result in the edges of the wafer 36 coming into contact with structural components of the process stations, thereby causing damage to the wafer 36. As will become apparent below, the present invention is directed toward detecting the proper orientation of a wafer and realigning the wafer on the transport blade 48.

Figure 8:
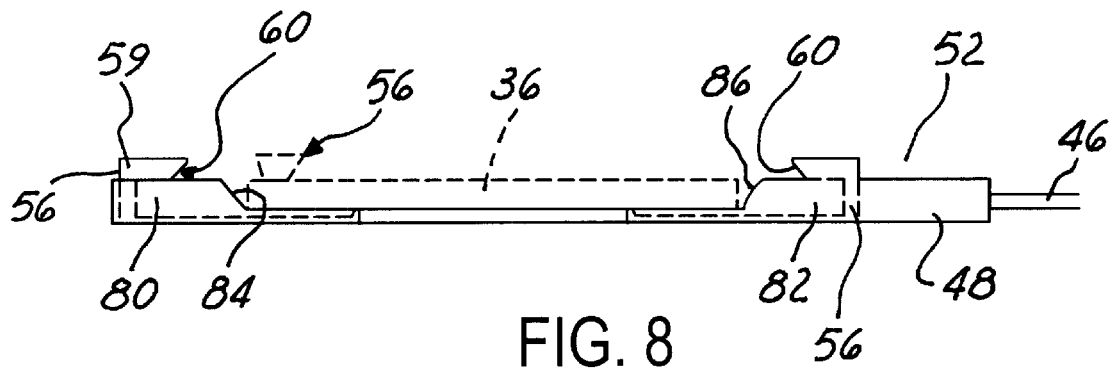
FIG. 8 is an enlarged, side view of the blade and clamps shown in the embodiments of FIGS. 4–7, the clamps being depicted in their open position.
Figure 9:
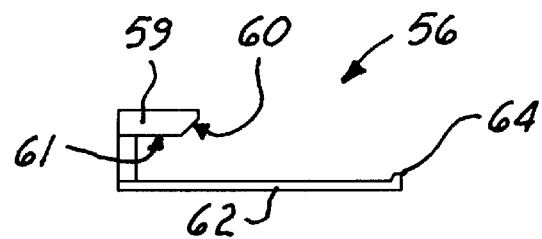
FIG. 9 is a side view of one of the clamps shown in FIGS. 4–8.

The wafer transfer unit 30 includes a robotic arm means comprising a pair of wings 44 rotatable about a vertical axis and a pair of corresponding outer robotic arms 46 hingedly connected to the wings 44 at pivot points 50. The robotic arm means is housed within a buffer chamber 28. The robotic arms 46, as discussed above form part of a robotic arm assembly (not shown) that is well known in the art and need not be described herein. Briefly, however, wings 44 are mounted to a pair of rings that pivot about a robot tube 38 and are respectively driven by a pair of stepper motors 40, 42. An elongate blade 52 is mounted on the outer ends of the two robotic arms 46, and includes a pair of upstanding, opposing ends 80, 82 (FIG. 8), which respectively include opposing, arcuate bases that retain the wafer 36 therebetween. As has been seen in FIG. 8, the walls 80, 82 include corresponding beveled edges 84, 86 which act as inclined surfaces that may engage the edges of the wafer 36 and tend to guide the wafer 36 into flat, face-to-face contact with the body of the blade 48, so as to be properly aligned.

In order to sense whether the wafer 36 is properly aligned on the blade 48, a laser detection system is provided in the form of a pair of lasers 52 mounted on top of the blade 48 (see FIG. 3), and a corresponding pair of sensors 32 which are shown herein as being mounted on a suitable surface of the processing equipment, such as on a chamber wall. It should be noted here that the sensors 32 could also be mounted on the blade 48, on the side of the wafer 36 opposite the lasers 52. This arrangement, while providing information about alignment of the wafer 36 relative to the blade 48, would not provide information as to whether the wafer 36 as well as the blade 48 were properly aligned relative to the other parts of the processing equipment, such as door slits through which the wafer 36 must be transported.

It may be appreciated that the sensors 32 are aligned relative to the lasers 52 such that when, for example, a wafer 36 is disposed in a tilted position on the blade 48, the wafer 36 itself blocks the delivery of the laser light to the sensor 32, thereby detecting an out of alignment condition. The laser detection system described above may be connected to the controller (not shown) that operates the sequencing of the equipment, including the wafer transport system 30 so as to interrupt the wafer transfer process when alignment error has been detected. In the preferred embodiment, as will become apparent below, when the wafer 36 is out of alignment by a certain threshold amount, this mis-alignment is not detected by the laser detection system, and the novel clamping assembly of the present invention is operative to move the wafer 36 into a desired position thus eliminating the misalignment, as part of the initial clamping process. However, when the degree of wafer misalignment is above the threshold, which the clamping assembly cannot correct, then the laser detection system issues a signal that results in an interruption of the wafer transport process.

Referring now specifically to FIGS. 4, 5, 8, and 9, in accordance with the present invention a clamping system is employed to both correct minor misalignment or tilting of the wafer 36 on the blade 48, and clamp the wafer 36 on the blade 48. The clamping system broadly comprises four clamping members 56, a central hub 66 rotatively mounted on the blade 48 and a drive cable 70 that drivingly connects the hub 66 with a rotating gear 54 operated by one of the arms 46. The clamps 56 are respectively mounted on four corners of the blade 48, around the periphery of the wafer 36. Each of the clamps 56 includes an elongate base 62 having a pin 64 at one end thereof, and a clamping head 59 at the opposite end thereof. The clamping head 59 includes a first, beveled surface 60 along one edge thereof, and a second, bottom clamping surface 61 which is adapted to engage or at least overlie the upper surface of wafer 36.

Figure 4:
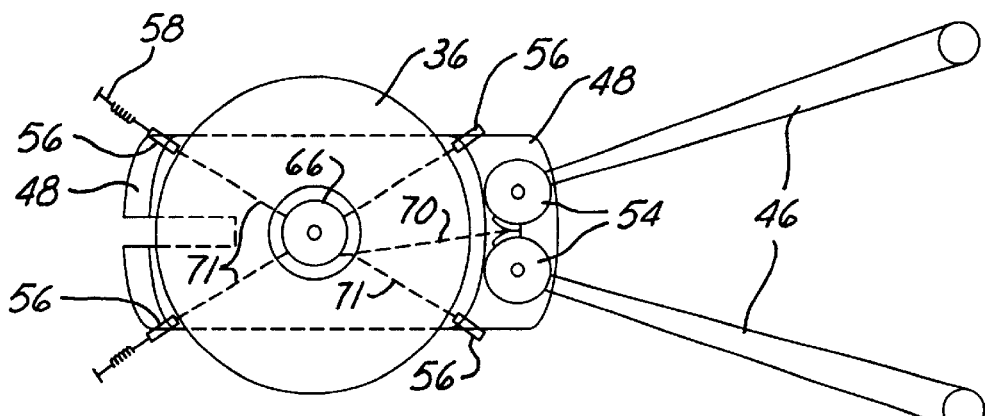
FIG. 4 is an enlarged, plan view of the transport system forming the preferred embodiment, the clamping assemblies shown in the unclamped position.
Figure 5:
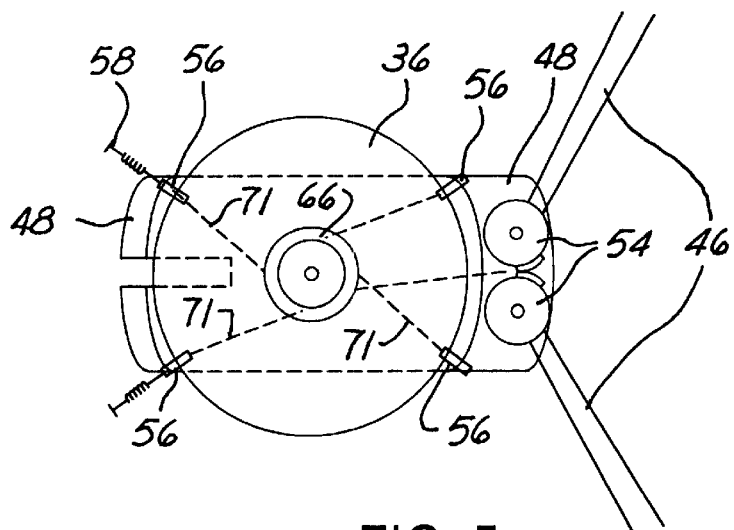
FIG. 5 is a view similar to FIG. 4 but showing the clamping assemblies in their clamped position.

Clamps 56 are slidably mounted on the blade 48 and are normally biased by a spring 58 (only two being shown for sake of simplicity) to shift outwardly away from the wafer 36 to the clamp's retracted or open position as shown in FIG. 4. Pin 64 is connected by a cable 71 to hub 66 which, as previously indicated is rotatably mounted on the blade 48. When the robot arm gear 54 rotates, cable 70, which is pinned to the outer periphery of hub 66, causes the latter to rotate, thereby drawing the cables 71 and thus moving the clamps 56 inwardly to the position shown in FIG. 5. As may best be appreciated from FIGS. 8 and 9, as the clamps 56 move radially inwardly, if the edge of the wafer 36 is slightly out of alignment, the beveled surface 60 of clamp 56 engages the edge of the wafer and forces it downwardly so that the wafer 36 comes to rest in face to face, aligned contact with the blade 48. The inclined or beveled surface 84 on the blade 48 cooperates with beveled surface 60 to facilitate this shifting movement of the wafer 36. Once the clamp 56 has shifted inwardly, the bottom clamping surface 61 overlies the outer periphery of the wafer 36 and thus prevents the wafer 36 from falling off or otherwise being dislodged from the blade 48.

Figure 6:
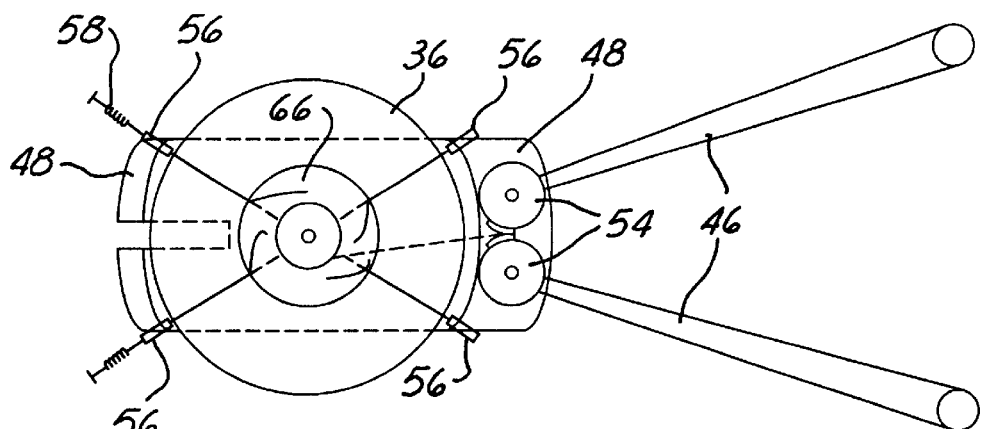
FIG. 6 is a view similar to FIG. 4 but depicting an alternate form of the invention.
Figure 7:
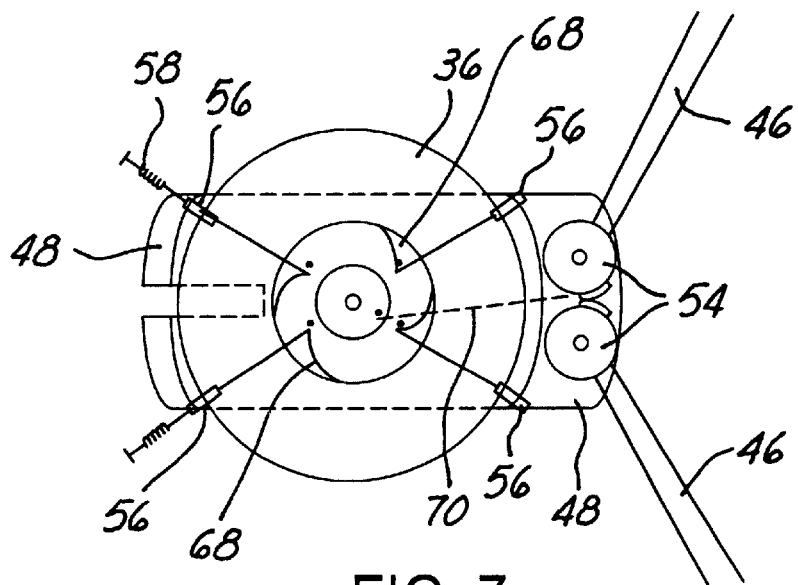
FIG. 7 is a view similar to FIG. 6 but showing the clamping assemblies in their closed, clamping position.

An alternate embodiment of the invention is depicted in FIGS. 6 and 7. Unlike the embodiment shown in FIGS. 4 and 5 wherein the hub 66 is connected to the clamps 56 by means of drive cables 71, the pins 64 are received in arcuate slots 68 formed within the hub 66. With the pins 64 captured in the actuate slots 68, rotation of the hub 66 results in camming of the pins 64, thereby drawing them radially inwardly while the hub 66 is rotated in response to further movement of the cable 70.

From the foregoing, it may be appreciated that the wafer transport and clamp system described above not only provides for the reliable accomplishment of the objects of the invention, but it does so in a particularly economical and efficient manner. It is recognized, of course, that those skilled in the art may make various modifications or additions chosen to illustrate the preferred embodiment without departing from the spirit and scope of the present contribution to the art. Accordingly, it is to be understood that the protections sought and to be afforded hereby should be deemed to extend to the subject matter claimed and all equivalents thereof fairly within the scope of the invention.

What is claimed is:

1. Apparatus for holding and transferring as semiconductor wafer, comprising:

robotic arm means for transferring said wafer:
  a blade attached to said arm means for supporting and holding said wafer thereon;
  clamp means shiftably mounted on said blade for moving said wafer into a desired position on said blade and for clamping said wafer on said blade, said clamp means includes a plurality of clamps each including a beveled surface engaging an upper peripheral edge and imposing a lateral force on said wafer causing said wafer to move toward said desired position; and
  means for driving said clamp means between a retracted position, and a closed, clamping position, said drive means includes a rotatable hub carried on said blade, and each of said clamps is connected with driven by said hub.

2. The apparatus of claim 1, wherein said hub is connected with and driven to rotate by said robotic arm means.

3. The apparatus of claim 1, wherein said hub includes a plurality cam surfaces respectively engaging said clamps.

4. The apparatus of claim 1, wherein each of said clamps includes an elongated arm extending radially inward toward said hub, and a pin connecting said arm to said hub.

5. The apparatus of claim 1, including means for normally biasing each of said clamps toward said retracted position.

6. The apparatus of claim 1, including a laser detection means for detecting whether said wafer is in said desired position thereof on said blade.

7. The apparatus of claim 1, wherein each of said clamps includes a pin receivable within an arcuate slot in said hub providing a camming action on said clamp.

8. Apparatus for holding and transporting a semiconductor wafer, comprising:

a blade for supporting said wafer thereon;

a plurality of guide clamps reciprocally mounted on said blade at locations spaced around the periphery of said wafer, each of said guide clamps includes a first surface for engaging and moving said wafer toward said desired position, and a second surface overlying the top surface of said wafer for clamping said wafer in said desired position; and means for moving said guide clamps into engagement with said wafer to move said wafer into a desired position on said blade, said means including a central drive hub rotatably mounted on said blade, and each of said clamps is connected to and driven to reciprocate by said hub.

9. The apparatus of claim 8, wherein said blade includes a beveled edge for guiding said wafer into said desired position; and each of said clamps includes a beveled surface for engaging said wafer and cooperating with said beveled surface on said blade to guide said wafer into said desired position.

10. The apparatus of claim 8, including means for detecting whether said wafer is in said desired position.

11. The apparatus of claim 8, including robotic arm means connected with said blade for transporting said wafer, and wherein said clamps are driven by said arm means.

* * * * *